(12) United States Patent
Garner (10) Patent No.: US 10,938,384 B2
(45) Date of Patent: Mar. 2, 2021

(54) PULSE MODULATOR

(71) Applicant: TELEDYNE UK LIMITED, Chelmsford (GB)

(72) Inventor: Paul Anthony James Garner, Essex (GB)

(73) Assignee: TELEDYNE UK LIMITED, Chelmsford (GB)

( * ) Notice: Subject to any disclaimer, the term of this patent is extended or adjusted under 35 U.S.C. 154(b) by 0 days.

(21) Appl. No.: 16/986,762

(22) Filed: Aug. 6, 2020

(65) Prior Publication Data
US 2021/0021259 A1    Jan. 21, 2021

Related U.S. Application Data

(63) Continuation of application No. 15/516,663, filed as application No. PCT/GB2015/052904 on Oct. 5, 2015, now abandoned.

(30) Foreign Application Priority Data

Oct. 3, 2014 (GB) .................................. 1417564
Nov. 18, 2014 (GB) .................................. 1420438

(51) Int. Cl.
*H03K 7/08* (2006.01)
*H03K 17/0412* (2006.01)
(Continued)

(52) U.S. Cl.
CPC .............. *H03K 7/08* (2013.01); *H03H 11/32* (2013.01); *H03K 3/57* (2013.01); *H03K 17/0412* (2013.01);
(Continued)

(58) Field of Classification Search
CPC ....... H03K 17/0412; H03K 7/08; H03H 11/32
(Continued)

(56) References Cited

U.S. PATENT DOCUMENTS 3,503,017 A    3/1970 Jasper
4,811,065 A *  3/1989 Cogan ................. H01L 27/0727
                                                  257/328
(Continued)

FOREIGN PATENT DOCUMENTS

EP       2434644 A1     3/2012
GB       2458704 A      9/2009
WO     2015/121015 A1   8/2015

OTHER PUBLICATIONS

Cook, E. G., et al, "Solid-State Modulators for RF and Fast Kickers", Proceedings of 2005 Particle Accelerator Conference, IEEE, 2005 (Year: 2005).*
(Continued)

*Primary Examiner* — Tomi Skibinski
(74) *Attorney, Agent, or Firm* — FisherBroyles, LLP; Robert Kinberg (57) ABSTRACT

A pulse modulator comprises a solid state power switch having a source, a drain, a gate and a separate gate drive connected to ground. One pulse modulator comprises a plurality of stages connected as an induction adder. Each stage includes a plurality of cells and at least some of the cells each include a solid state power switch having a source, a drain, a gate and a separate gate drive connected to ground to control the discharge of a capacitor. In one embodiment the solid state power switch is a power MOSFET.

21 Claims, 8 Drawing Sheets

(51) Int. Cl.
*H03H 11/32* (2006.01)
*H03K 17/12* (2006.01)
*H03K 17/10* (2006.01)
*H03K 3/57* (2006.01)

(52) U.S. Cl.
CPC ......... *H03K 17/102* (2013.01); *H03K 17/122* (2013.01)

(58) Field of Classification Search
USPC .......................................... 327/106–108, 175
See application file for complete search history.

(56) References Cited

U.S. PATENT DOCUMENTS

| | | | |
|---|---|---|---|
| 4,818,895 A | 4/1989 | Kaufman | |
| 4,945,445 A | 7/1990 | Schmerda et al. | |
| 4,973,876 A * | 11/1990 | Roberts | B06B 1/0253 310/316.01 |
| 5,038,051 A * | 8/1991 | Firman | H03K 17/122 307/106 |
| 6,057,726 A | 5/2000 | Sumida | |
| 6,066,901 A | 5/2000 | Burkhart et al. | |
| 6,078,204 A * | 6/2000 | Cooper | B60T 8/268 327/309 |
| 6,097,113 A | 8/2000 | Teraoka et al. | |
| 6,384,544 B1 * | 5/2002 | Greenwood | H05B 41/392 315/291 |
| 6,831,377 B2 | 12/2004 | Yampolsky et al. | |
| 7,994,826 B2 | 8/2011 | Ishikawa et al. | |
| 2002/0140464 A1 | 10/2002 | Yampolsky et al. | |
| 2005/0253165 A1 | 11/2005 | Pace et al. | |
| 2010/0102885 A1 * | 4/2010 | Heston | H03F 1/565 330/277 |
| 2011/0122657 A1 * | 5/2011 | Lawson | H02M 3/155 363/20 |
| 2012/0262220 A1 | 10/2012 | Springett | |
| 2014/0021487 A1 | 1/2014 | Masood et al. | |

OTHER PUBLICATIONS

Wang, Y., et al, "A Megawatt Solid-State Modulator for High Repetition Rate Pulse Generation", Review of Scientific Instruments, Feb. 24, 2016 (Year: 2016).*
Cook, E.G. et al., Solid-State Modulators for RF and Fast Kickers, Proceedings of the 2005 Particle Accelerator Conference, Knoxville Tennessee, IEEE 2005, Piscataway, NJ, May 16, 2005, pp. 637-641.
Stueckler, F. et al., Performance Improvement of a CoolMOS (TM) C7 650V Switch in a Kelvin Source Configuration, Int. Conf. and Exhibition for Power Electronics, Intelligent Motion, Renewable Energy and Energy Management, Nuremberg, May 14-16, 2013, pp. 636-641.
Siu, K.KM. et al., Performance Analysis of Package Parasitic Inductances for Fast Switching MOSFET in Converter, IEEE Int. Power Electronics and Application Conf. and Exposition (PEAC), Nov. 5-8, 2014, Shanghai, pp. 314-319.
Stueckler, F. et al., CoolMOS (TM) C7 650V Switch in a Kelvin Source Configuration, Infineon Application Note AN, May 2013, pp. 4-10.
International Search Report for PCT/GB2015/052904, dated Dec. 23, 2015.
Written Opinion for PCT/GB2015/052904, dated Dec. 23, 2015.
GB Search Report for GB Application No. 1417564.0, dated Mar. 30, 2015.
GB Amendment to Search Report for GB Application No. 1417564.0, dated Apr. 27, 2015.
GB Search Report for GB Application No. 1417564.0, dated Apr. 7, 2016.
GB Search Report for GB Application No. 1420438.2, dated May 14, 2015.

* cited by examiner

PULSE MODULATOR

FIELD OF THE INVENTION

This invention relates to a pulse modulator.

BACKGROUND

Pulse modulators using solid state switches to control discharge of capacitors can provide flexibility in operating voltage, duty cycle and pulse width to generate pulses for application to a load. For higher power requirements, the switches may be arranged in cells which are stacked together and connected so as to provide a combined output.

BRIEF SUMMARY

According to a first aspect of the invention, a pulse modulator comprises a solid state power switch having a source, a drain, a gate and a separate gate drive connected to ground. Parasitic inductance and capacitance of the switches reduce achievable switching speeds. However, by including the separate gate drive ground, the effect of the source inductance is reduced and thus faster switching speeds can be reached than would otherwise be possible and fast switch times from a given power switch can be obtained. In one embodiment, the solid state power switch is a power MOSFET. Other embodiments may use other types of power switches such as the IGBT and BJT.

In one embodiment, the pulse modulator comprises a plurality of stages, each stage including a plurality of cells, and at least some of the cells each including a solid state power switch having a source, a drain, a gate and a separate gate drive connected to ground.

In one embodiment, the plurality of stages is connected as an induction adder. The induction adder enables high voltages and high currents to be obtained by inductively adding voltages from the plurality of cells. In one embodiment, each stage includes a magnetic induction core, a single turn primary winding and a single turn secondary winding and the secondary windings are connected in series. In another embodiment, a plurality of secondary windings is included.

In one embodiment, for example, the pulse modulator generates pulses that can have a pulse rise time of up to less than 5 nanoseconds and a pulse length of between 15 and 20 nanoseconds. Short pulse widths may be obtained with relatively low cost components. The particular parameter values of the pulses are chosen in view of the requirements of the application. High pulse repetition rates may be achieved. For example, pulses having repetition rate of up to 1000 pulses per second may be generated. In one embodiment, pulses having repetition rate of several MHz can be achieved. In one embodiment, for example, the pulse modulator is operative to generate pulses with a peak power of the order of tens of megawatts and it may generate pulses with a peak power in the range 30 to 40 MW. Significantly, in one embodiment, a pulse modulator in accordance with the invention operating to generate pulses with tens of megawatts peak power can be realised in a small volume, with typical dimensions equal to, or less than, 120 mm×240 mm and a depth depending on the number of stages, for example, about 500 mm where ten or so stages are included.

By suitably controlling switching, pulses of different characteristics can be produced, giving great flexibility. In one embodiment, the switches are controlled so as to generate a train of pulses having characteristics which change over the duration of the train. In another embodiment, the pulse characteristics are kept constant.

In an embodiment, at least some of the cells each include a gate driver and a balun, the gate driver being connected to the gate of the power switch via the balun. The balun provides an isolated gate drive, enabling the switch time to be reduced compared to an arrangement without a balun. During the switch transition, a voltage is induced across the source inductance due to the rate of change of current through it. This voltage opposes the gate voltage and reduces the voltage driving the current into the gate. In one embodiment, the switch time is more than three times faster when a balun is included than without one.

In one embodiment, a Zener diode is included via which the separate gate drive is connected to ground. The Zener diode is used to prevent overvoltage of the device gate.

The pulse modulator may include a diode, such as, for example, a Schotkky diode, in series with the power switch. The diode prevents conduction of the switch parasitic antiparallel diode which might otherwise result in the switch latching into conduction, leading to failure.

In one embodiment, the pulse modulator may include a non-linear snubber network to dissipate reflected energy in a cell.

The diode and snubber network enhancements are not essential for a pulse modulator in accordance with the invention but may allow it to operate under more demanding conditions.

In one embodiment, the cells of the plurality of cells are nominally identical. In another embodiment, they are non-identical which may be advantageous in generating more complex outputs.

According to a second aspect of the invention, a pulse modulator system comprises a pulse modulator in accordance with the second aspect of the invention and a load, the pulse modulator being connected to apply pulses across the load.

A pulse modulator and pulse modulator system in accordance with the invention may be advantageously used in a number of applications, including, but not limited to: digitally controlled very high power high frequency transmitters; high frequency induction heating for domestic or industrial applications; high frequency switched mode power supplies; or adaptive ultra wide band transmitters for secure radio. It will be appreciated that the compact size, flexibility, fast rise times, high power and high repetition rate with low jitter that may be available from a pulse modulator in accordance with the invention will be attractive for many applications.

BRIEF DESCRIPTION OF THE DRAWINGS

Some embodiments of the present invention will now be described by of example only, and with reference to the accompanying drawings, in which.

DETAILED DESCRIPTION

Figure 1:
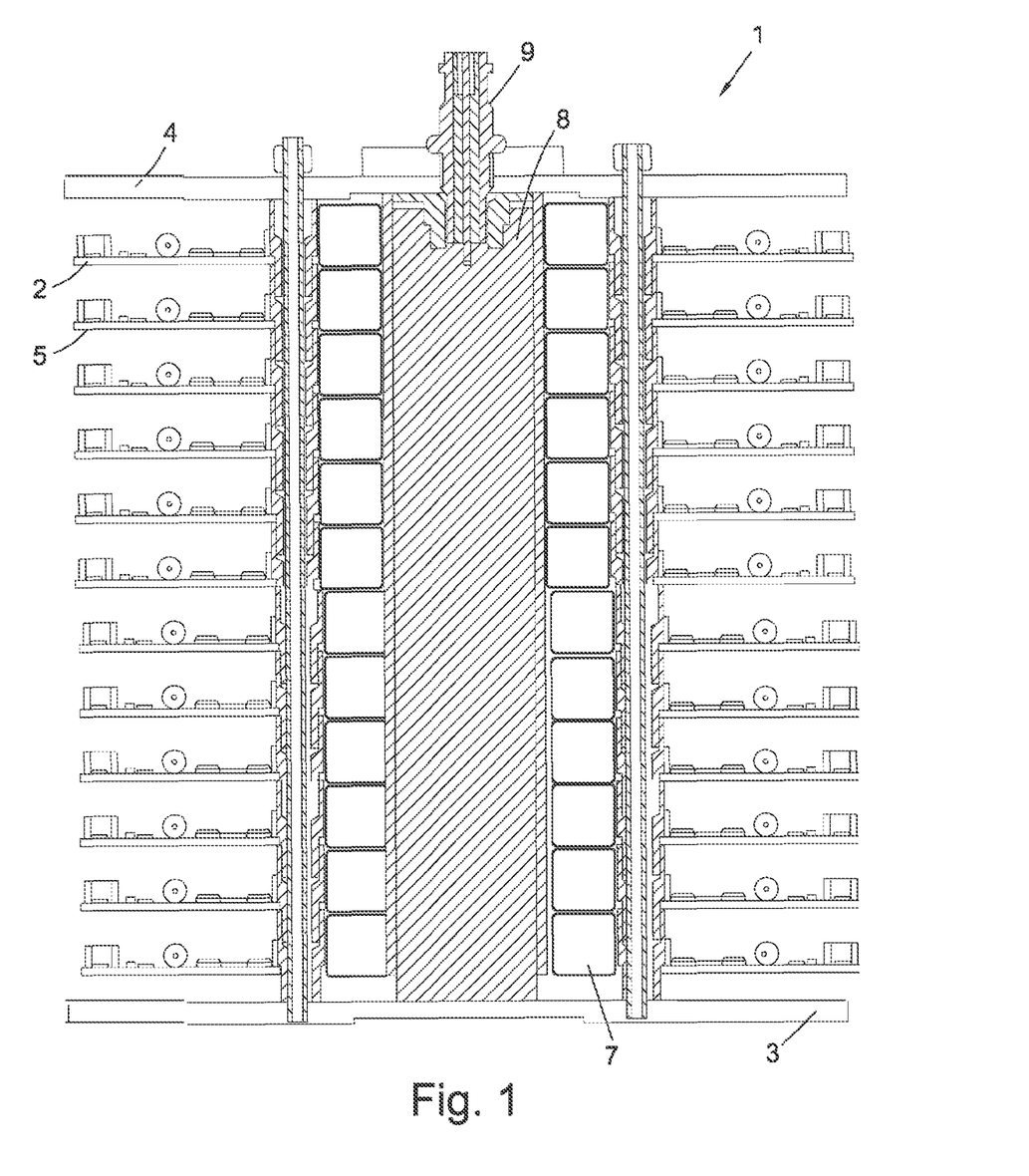
FIG. 1 schematically illustrates in longitudinal cross section a pulse modulator in accordance with the invention.
Figure 2:
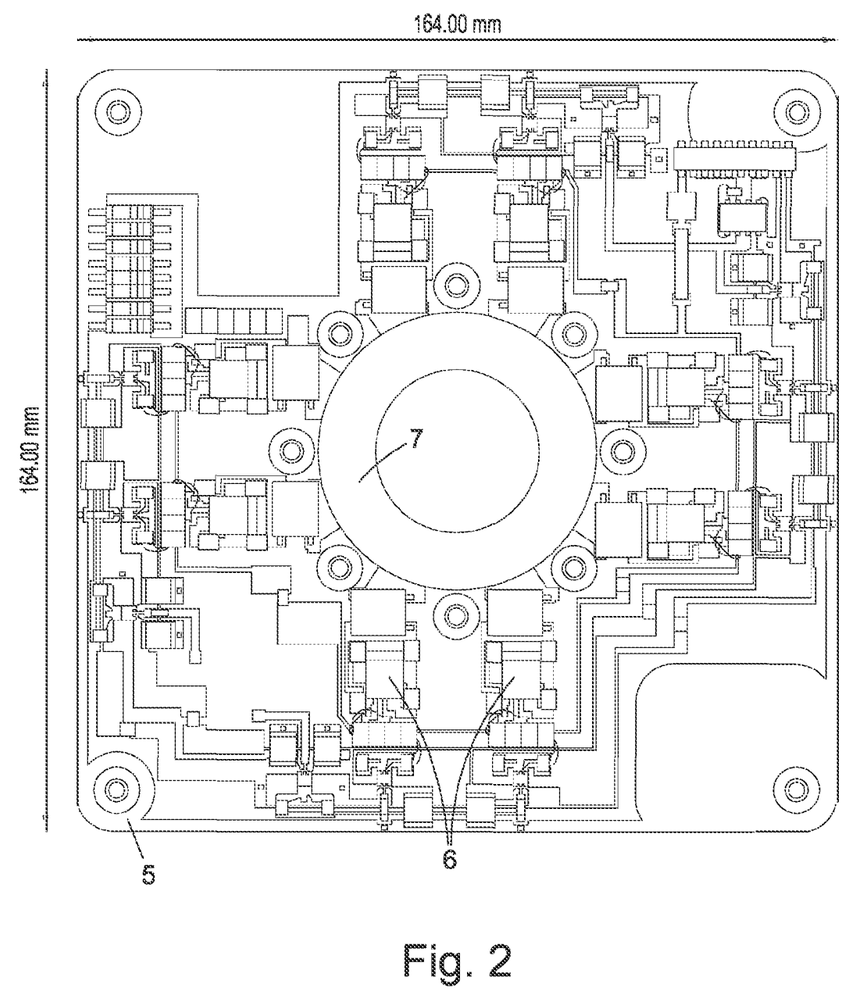
FIG. 2 schematically illustrates a stage of the pulse modulator of FIG. 1.
Figure 3:
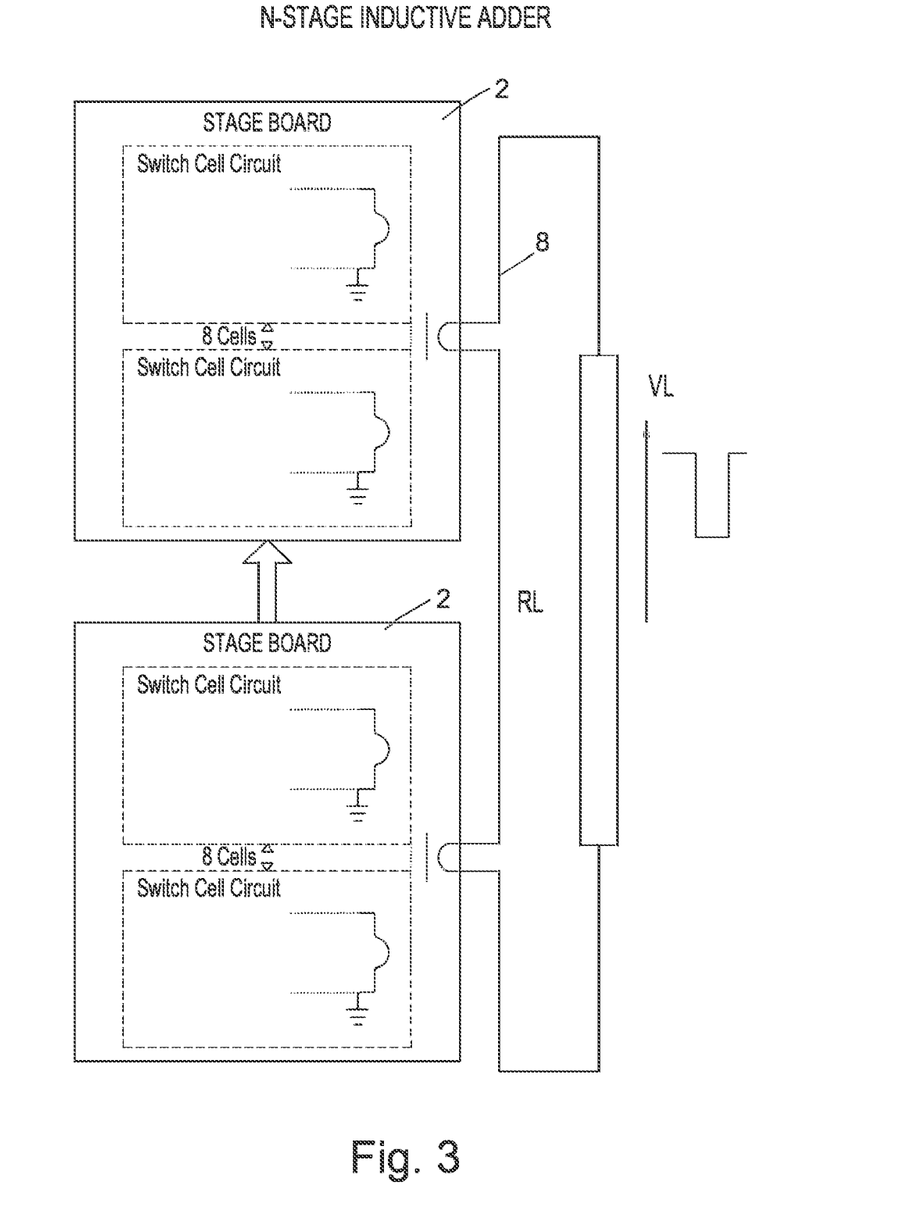
FIG. 3 is schematic diagram illustrative of the inductive adder of the pulse modulator of FIG. 1.

With reference to FIG. 1, a pulse modulator 1 includes twelve identical stages 2 stacked between a ground plate 3 and an end plate 4. One stage 5 is shown in plan view in FIG. 2 and has dimensions of 164 mm×164 mm with a depth of 15 mm. The distance between the ground plate 3 and end plate 4 is approximately 400 mm. If more or fewer stages are included the distance is greater or less than 400 mm. The stage 5 carries eight cells 6, each cell including a single solid state FET switch. The stage 5 includes a single turn primary winding and a single turn secondary winding on a magnetic core 7 for each cell. The secondary windings of all of the stages 2 are connected in series, as shown schematically in FIG. 3, to provide a twelve-stage inductive adder. The output voltage on the secondary winding 8 is the sum of all of the voltages appearing on the primary windings and is taken from the pulse modulator 1 via a coaxial output 9.

Figure 4:
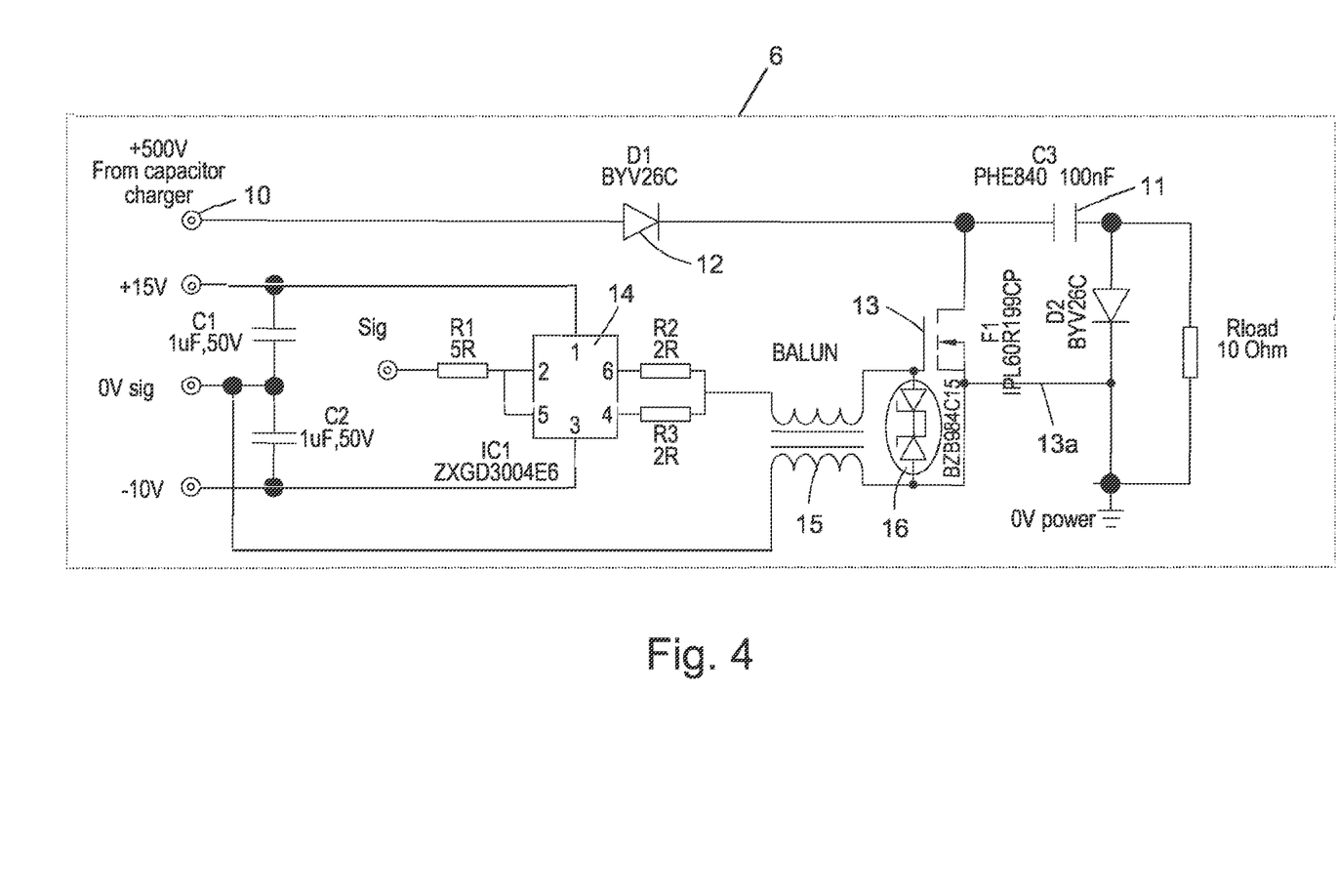
FIG. 4 is a schematic circuit diagram of a single FET cell.

With reference to FIG. 4, a single cell 6 includes an input 10 to which the output of a capacitor charger is applied to a capacitor 11 of 100 nF via a diode 12.

The discharge of the capacitor 11 is controlled using solid state switch 13 which in this embodiment is a MOSFET 13.

In a power MOSFET, the theoretical carrier transit time from drain to source is on the order of 200 ps. The gate driver and the MOSFET parasitic inductance and capacitance determine the achievable switching speed.

Figure 5:
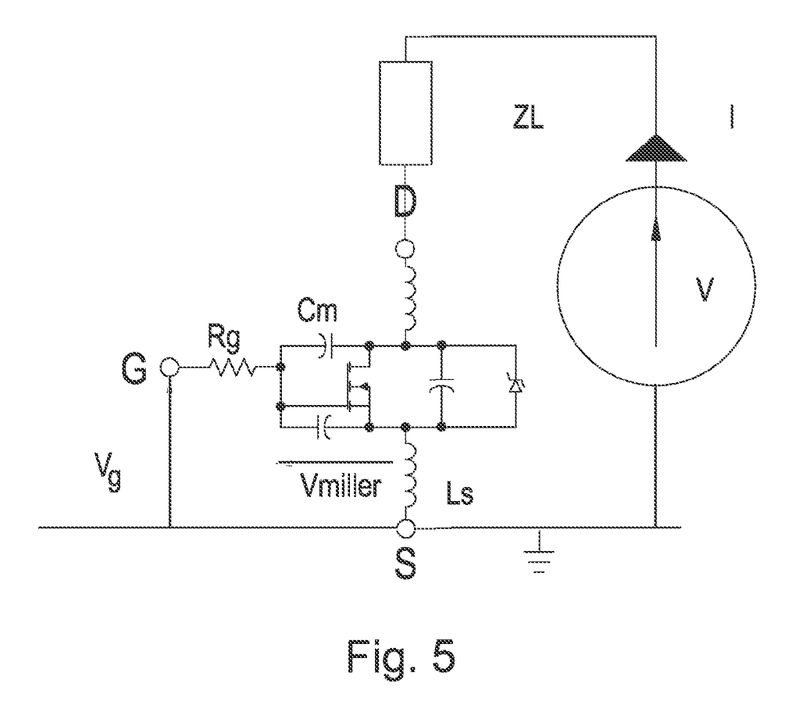
FIG. 5 illustrates practical switching limitations of an FET.

With reference to FIG. 5, which a switching model of a MOSFET showing the most important parasitic components, assuming the trans-conductance of the MOSFET is large, the switch closure time, Tr, can be estimated as:

$$T_r \approx \frac{C_m \cdot V \cdot R_g - L_s \cdot I}{V_g - V_{Miller}}$$

where V is the switched voltage, I is the switched current, $L_s$ is the source parasitic inductance, $R_g$ is the gate resistance, $V_g$ is the gate voltage, $C_m$ is the Miller capacitance, and $V_{Miller}$ is the Miller voltage. The Miller voltage is the voltage on the gate during switch transition and is greater than the threshold voltage.

Figure 6:
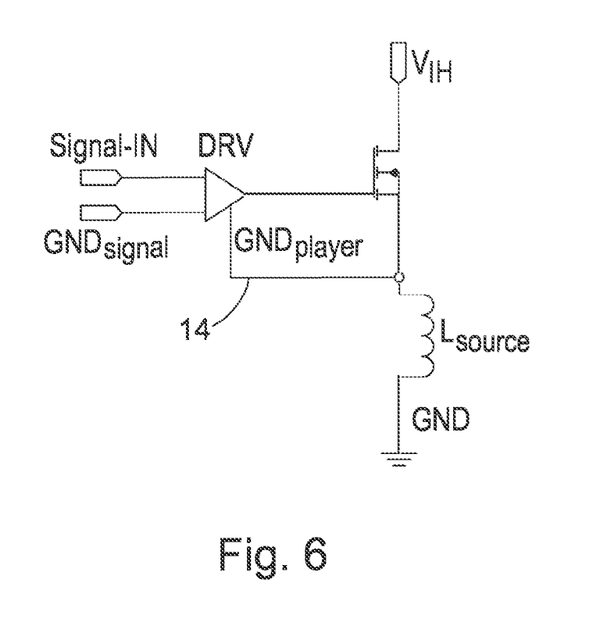
FIG. 6 illustrates a component of the single cell shown in FIG. 4.

Thus, by using a power switch with a separate gate drive connected to ground, the influence of the source inductance on the switching time can be minimised to obtain the fastest switching time possible from a device of this rating. The MOSFET 13 in this embodiment is an Infineon IPL60R199CP as shown in FIG. 6 and has a low parasitic inductance of 1.83 nH separate pin-outs for the gate drive ground and the source ground.

Figure 7A:
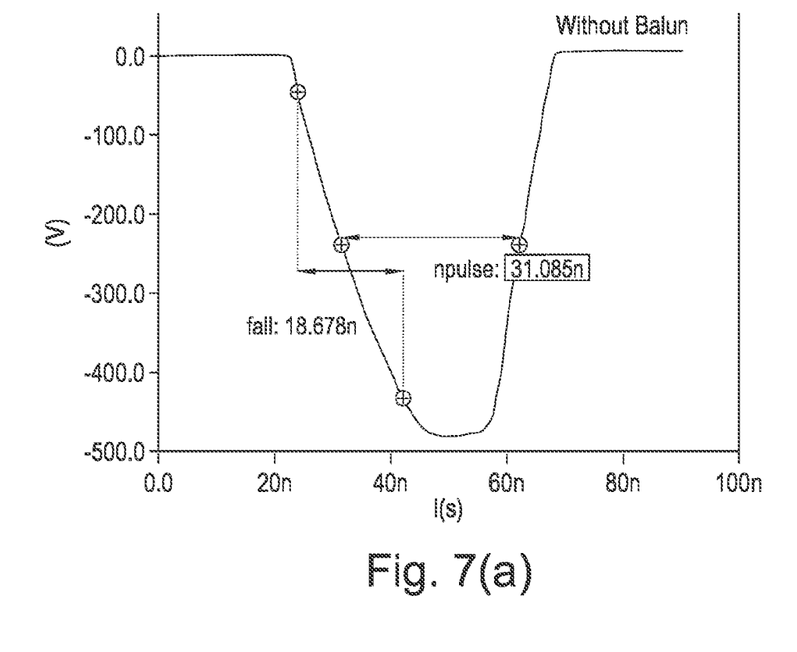
FIGS. 7a and 7b illustrate the outputs from alternative configurations of an FET cell.
Figure 7B:
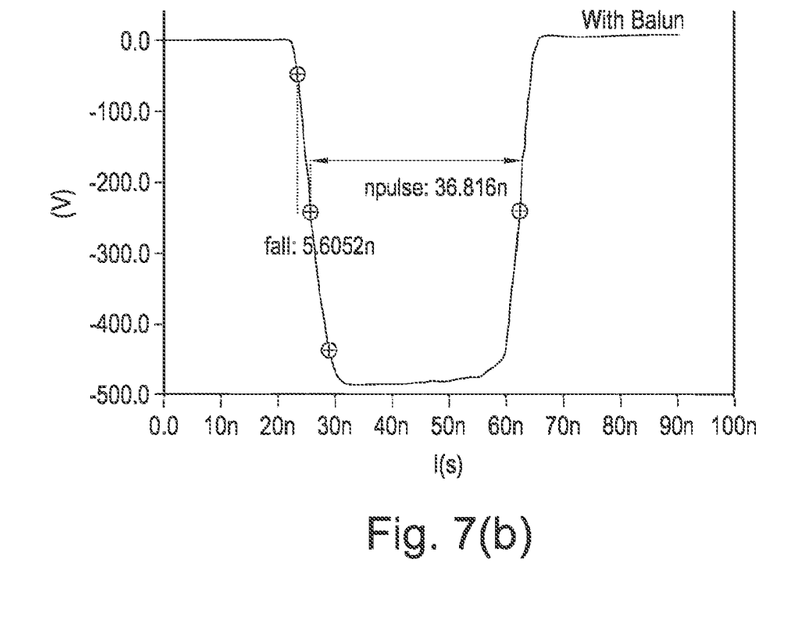

The MOSFET 13 is driven by a high-speed MOSFET gate driver 14 via a balun 15 which provides an isolated gate drive. The MOSFET 13 has a separate gate drive 13a connected to ground. A Zener diode 16 is connected between the gate of the MOSFET 13 and ground. The balun 15 enables a much faster switch time to be achieved, as illustrated in FIG. 7, where the circuit without a balun is shown in FIG. 7(a) and with a balun in FIG. 7(b).

In one embodiment, the operating voltage/current is 30 kV/1200A, and the impedance is 25 Ohms. The pulse rise time (10-90%) is 2 ns-5 ns, the pulse length is 15 ns-20 ns and the repetition rate is 1000 pulses per second with pulse jitter of 100 picoseconds (1σ) and a maximum pulse ripple of 5%. The pulse peak power is 30 MW.

Figure 8:
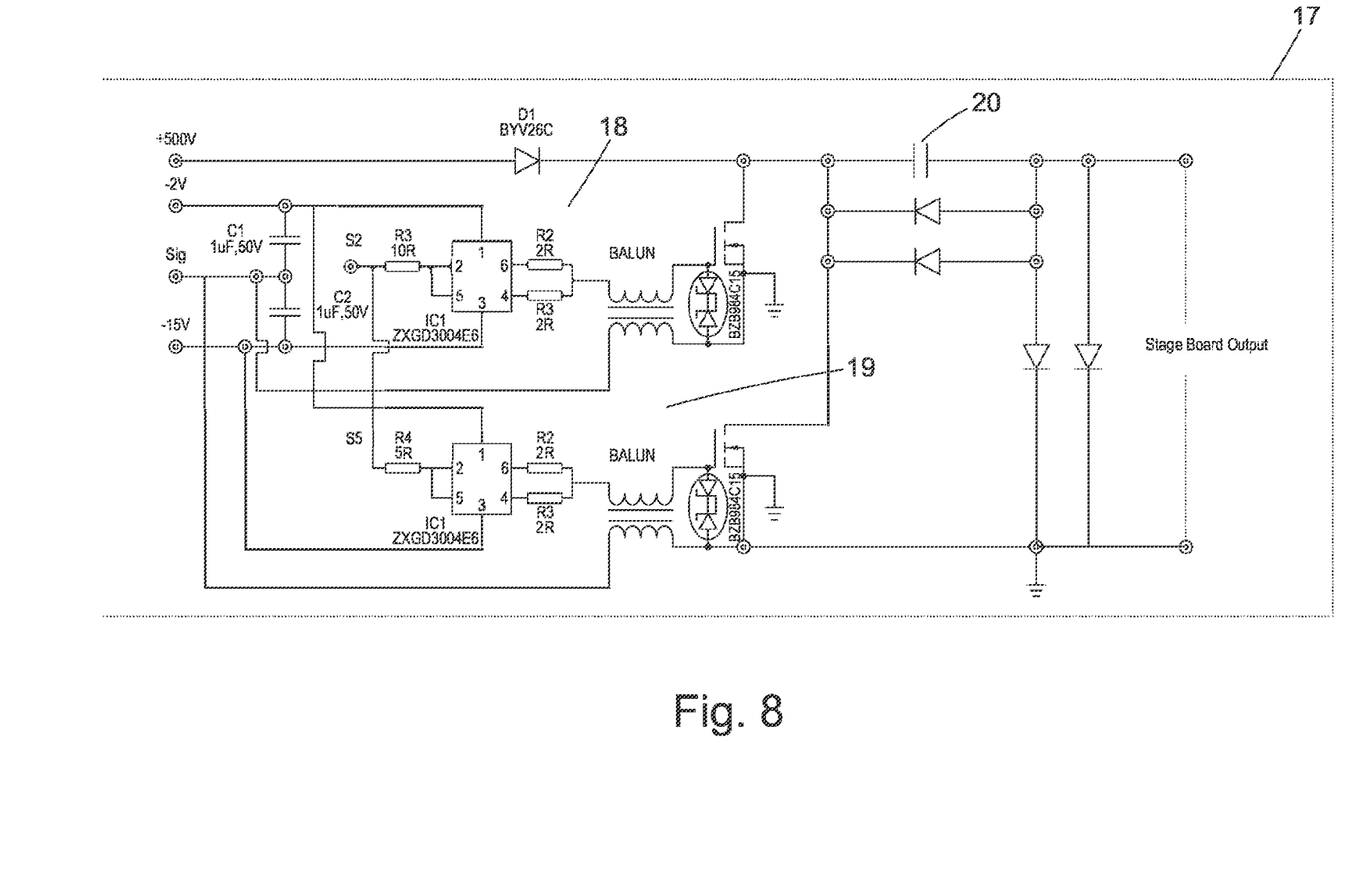
FIG. 8 is a schematic circuit diagram of a dual FET cell of another pulse modulator in accordance with the invention.

In another pulse modulator, illustrated in FIG. 8, a dual FET switching cell 17 includes two circuits 18 and 19 similar to that shown in FIG. 4 and have outputs which are combined to switch a capacitor 20.

Figure 9:
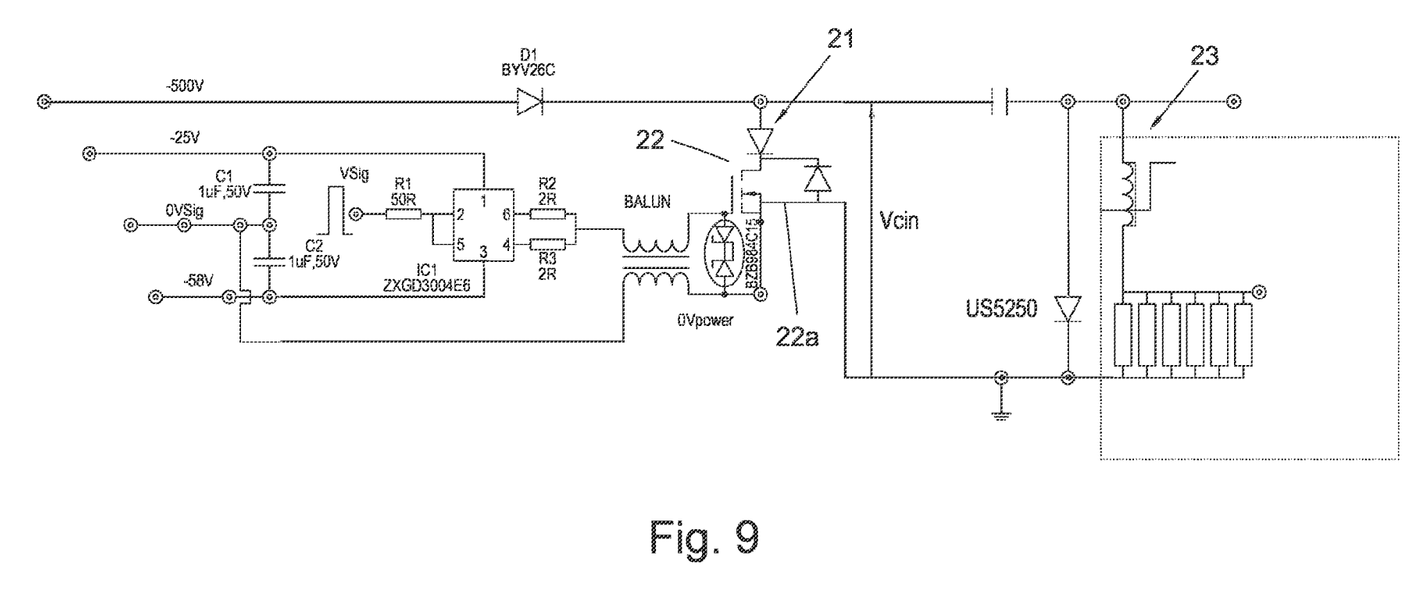
FIG. 9 is a schematic circuit diagram of a cell of another pulse modulator in accordance with the invention.

With reference to FIG. 9, another pulse modulator includes a Schottky diode 21 in series with FET 22 having a separate gate drive 22a. The diode 21 prevents conduction of the switch parasitic antiparallel diode which might otherwise result in the switch latching into conduction. A non-linear snubber network 23 dissipates reflected energy. These enhancements are not essential to a pulse modulator in accordance with the invention but may allow it to operate under more demanding conditions.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

The invention claimed is:

1. A pulse modulator, comprising a solid state power switch having a source, a drain, a gate, a gate driver connected to the gate and a separate gate drive arranged to be connected to the gate and to ground throughout a switch transition of the solid state power switch, wherein the gate driver and the separate gate drive are connected to the gate through separate pin-outs on the gate.

2. The pulse modulator as claimed in claim 1, wherein the solid state power switch comprises a plurality of solid state power switches, the pulse modulator further comprising a plurality of stages, each stage including a plurality of cells, and at least some of the cells each including at least one of the solid state power switches.

3. The pulse modulator as claimed in claim 2, wherein the plurality of stages is connected as an induction adder.

4. The pulse modulator as claimed in claim 2, wherein said at least some of the cells each include a gate driver and a balun, the gate driver being connected to the gate of the solid state power switch via the balun.

5. The pulse modulator as claimed in claim 2, wherein said at least some of the cells each include more than one of said solid state power switches having a source, a drain, a gate and a separate gate drive connected to ground.

6. The pulse modulator as claimed in claim 2, wherein each stage includes a magnetic induction core, a single turn primary winding and a single turn secondary winding and the secondary windings are connected in series.

7. The pulse modulator as claimed in claim 2, wherein said at least some of the cells each include a capacitor which is connected to be discharged by the solid state power switch to generate pulses.

8. The pulse modulator as claimed in claim 2, wherein each stage has dimensions of less than or equal to 120 mm×240 mm.

9. The pulse modulator as claimed in claim 2, wherein the cells of the plurality of cells are nominally identical.

10. The pulse modulator as claimed in claim 2, further including a non-linear snubber network to dissipate reflected energy in at least one of the cells.

11. The pulse modulator as claimed in claim 1, wherein the solid state power switch is a power MOSFET.

12. The pulse modulator as claimed in claim 1, further including a diode in series with the solid state power switch.

13. The pulse modulator as claimed in claim 12, wherein the diode is a Schottky diode.

14. The pulse modulator as claimed in claim 1, wherein the pulse modulator is operative to generate pulses having a pulse rise time of less than 5 ns and pulse length in the range 15 ns to 20 ns.

15. The pulse modulator as claimed in claim 1, wherein the pulse modulator is operative to generate pulses having repetition rate of greater than 1000 pps.

16. The pulse modulator as claimed in claim 15, wherein the pulse modulator is operative to generate pulses having repetition rate of greater than 1 megahertz.

17. The pulse modulator as claimed in claim 1, wherein the pulse modulator is operative to generate pulses with a peak power of the order of tens of megawatts.

18. The pulse modulator as claimed in claim 17, wherein the pulse modulator is operative to generate pulses with a peak power in the range 30 to 40 MW.

19. A system comprising a pulse modulator as claimed in claim 1, further including a load, the pulse modulator being connected to apply pulses across the load.

20. A pulse modulator comprising a plurality of solid state power switches, each solid state power switch having a source, a drain, a gate, and a separate gate drive connected to the gate, and a Zener diode via which the separate gate drive is arranged to be connected to ground throughout a switch transition of the solid state power switch, wherein each solid state power switch has an independent gate drive and the gate of each solid state switch is independently connected to ground via an independent Zener diode.

21. A pulse modulator comprising a plurality of solid state power switches, each solid state switch having a source, a drain, a gate, a gate driver connected to the gate and a separate gate drive arranged to be connected to the gate and to ground throughout a switch transition of the solid state power switch, wherein the pulse modulator includes a plurality of cells, and at least some of the cells including a single one of the solid state power switches arranged to switch the cell.

* * * * *